United States Patent [19]
Kawaguchi et al.

[11] Patent Number: 5,650,006
[45] Date of Patent: Jul. 22, 1997

[54] PROCESS FOR PRODUCING A LITHIUM NIOBATE-LITHIUM TANTALATE SINGLE CRYSTAL SUBSTRATE

[75] Inventors: Tatsuo Kawaguchi; Minoru Imaeda, both of Nagoya; Tsuguo Fukuda, Sendai, all of Japan

[73] Assignee: NGK Insulators, Ltd., Japan

[21] Appl. No.: 473,964

[22] Filed: Jun. 7, 1995

[30] Foreign Application Priority Data

Sep. 16, 1994 [JP] Japan .................................. 6-222081
Apr. 11, 1995 [JP] Japan .................................. 7-083939

[51] Int. Cl.$^6$ .................................................. C30B 19/02
[52] U.S. Cl. ............................... 117/54; 117/56; 117/64; 117/948; 423/179.5
[58] Field of Search ............................... 117/2, 54, 56, 117/58, 64, 918, 948; 427/162; 423/179.5

[56] References Cited

U.S. PATENT DOCUMENTS

| | | | |
|---|---|---|---|
| 3,998,687 | 12/1976 | Ballman et al. | 117/60 |
| 4,073,675 | 2/1978 | Ballman et al. | 117/63 |
| 5,209,917 | 5/1993 | Ohno et al. | 117/56 |

OTHER PUBLICATIONS

Kondo et al., "LPE Growth of Li(Nb,Ta)O3 Solid–Solution Thin Film Waveguides on LiTaO3 Substrates" 1979, pp. 314–322.

Miyazawa et al., "Optical Waveguide of LiNbO3 Thin Film Grown by Liquid Phase Epitaxy" 1975, pp. 8–10.

Fukuda et al., "LiNbO3 and LiTaO3 Growth by the Capillary Liquid Epitaxial Technique" 1980, pp. 291–298.

Journal of Crystal Growth, vol. 46, 1979, Amsterdam NL, pp. 314–322, XP002022268 Kondo: "LPE Growth of Li(nb, Ta)O3 solid–solution think film waveguides on LiTaO3 substrates".

Journal of Crystal Growth, vol. 132, No. 1/2, 1 Sep. 1993, Amsterdam NL, pp. 48–60, XP000474741 Yamada: "Liquid phase epitaxial growth of LiNbO3 thin film".

*Primary Examiner*—Felisa Garrett
*Attorney, Agent, or Firm*—Parkhurst, Wendel & Burr, L.L.P.

[57] ABSTRACT

A film made of lithium niobate-lithium tantalate solid solution may be formed on a single crystal substrate having a composition of $LiNb_{1-z}Ta_zO_3$ ($0 \leq z < 0.8$) by the liquid phase epitaxial process. The substrate is contacted with supercooled liquid phase of a melt to produce the film thereon. The melt consists mainly of $Li_2O_3$, $Nb_2O_5$, $Ta_2O_5$ and a flux. A composition of the liquid phase is within a region encompassed by a straight line K linking a point A (95, 5, 0) and a point B (95, 2, 3), a straight line G linking the point A (95, 5, 0) and a point C (60, 40, 0), a straight line H linking the point C (60, 40, 0) and a point D (60, 0, 40), a straight line J linking the point B (95, 2, 3) and a point E (0, 40, 60) and a curved line I defining a composition whose saturation temperature is not more than 1200° C. Each line is shown in a triangular diagram of a pseudo-ternary system of $LiNbO_3$-$LiTaO_3$—a melting medium. The composition of the solid solution may preferably be $LiNb_{1-x}Ta_xO_3$ ($0 \leq x < 0.8$, $z < x$).

5 Claims, 9 Drawing Sheets

FIG_2a
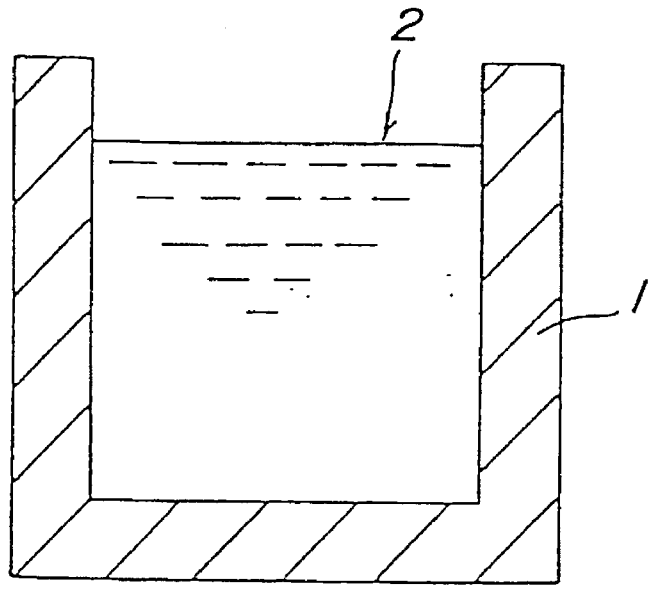
FIG_2b
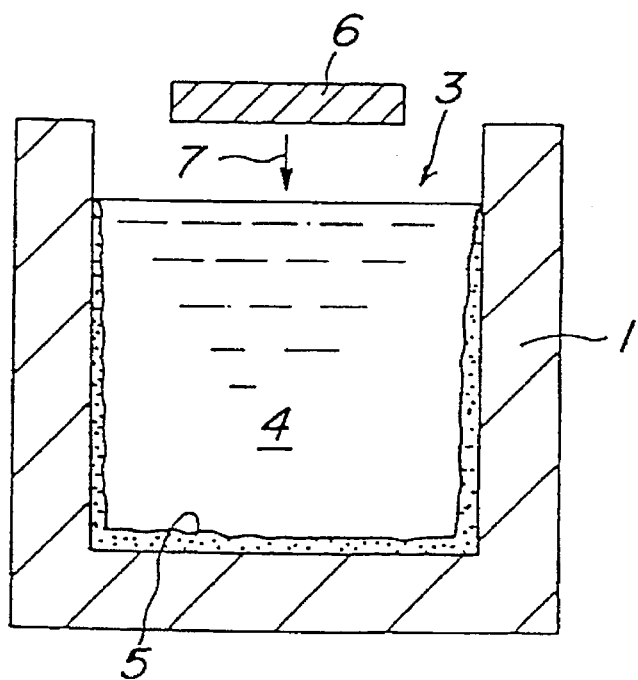

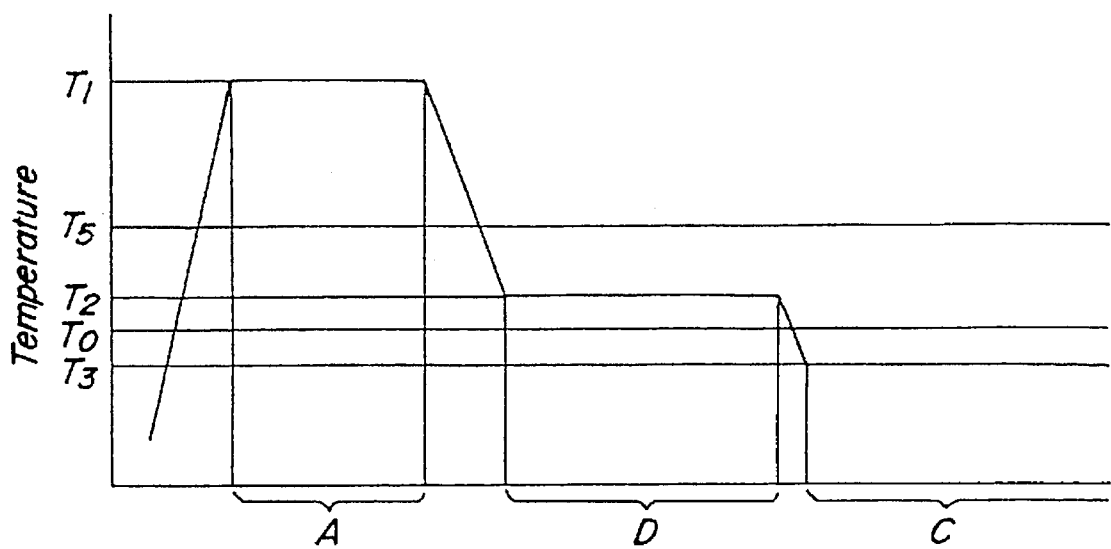
FIG_3

FIG_7a
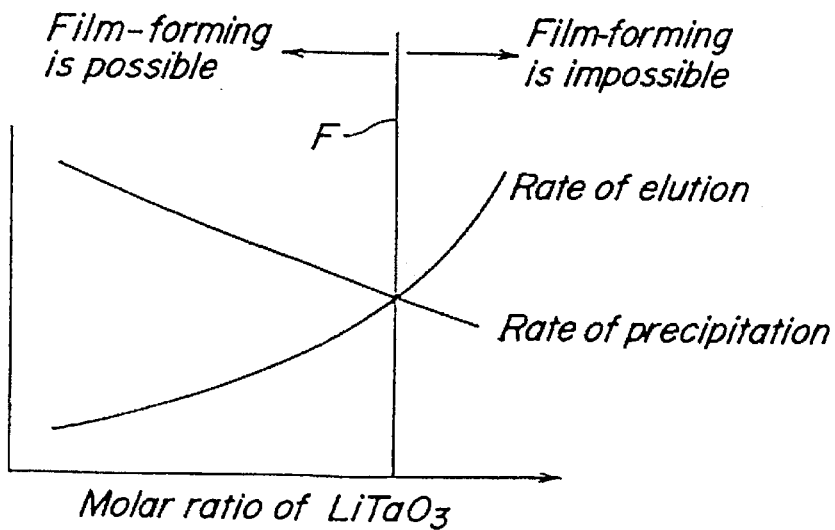
FIG_7b
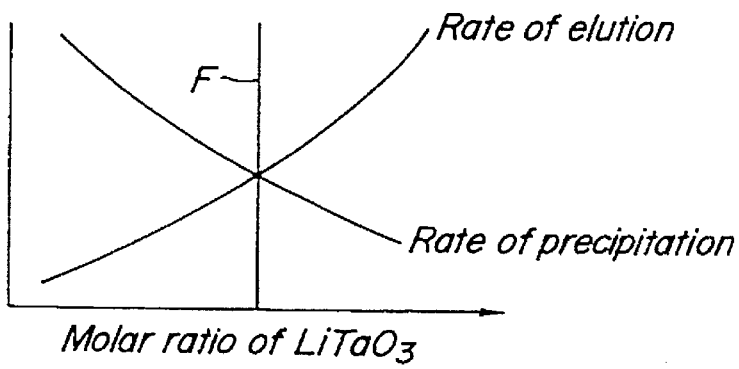
FIG_7c
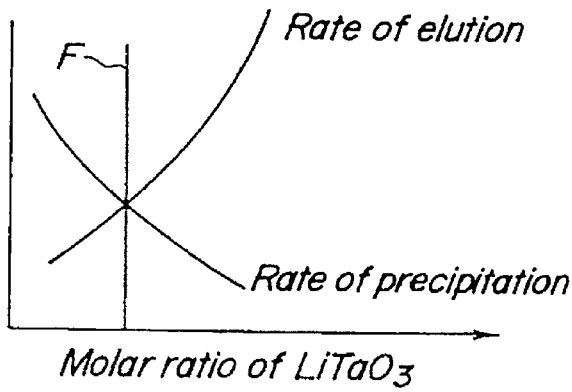

FIG_8
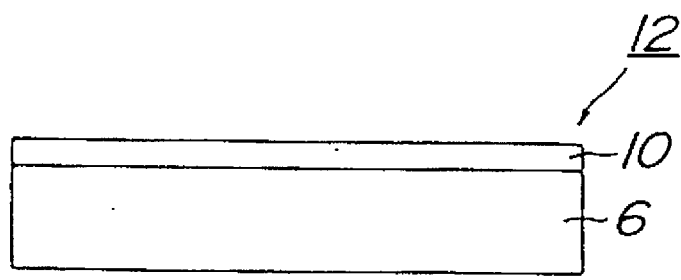
FIG_9
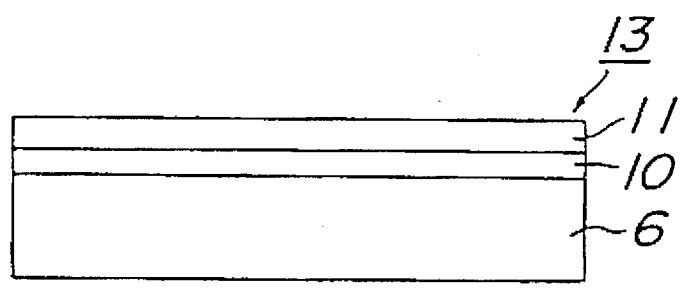

PROCESS FOR PRODUCING A LITHIUM NIOBATE-LITHIUM TANTALATE SINGLE CRYSTAL SUBSTRATE

BACKGROUND OF THE INVENTION

(1) Field of the Invention

The present invention relates to an article having a substrate of lithium niobate single crystal, especially to an optical waveguide substrate, and a process for producing the same.

(2) Related Art Statement

Lithium niobate (LiNbO$_3$) single crystal and lithium tantalate (LiTaO$_3$) single crystal have been expected as materials for optoelectronics. A liquid phase epitaxial process is expected as a process for producing thin films of the single crystal with excellent crystallinity and quality, because it is possible to produce the thin films at a temperature lower than a temperature at which the single crystals are produced by a so called "Czochralski" process.

For example, according to the description in "Journal of Crystal Growth", 46, (1979), pp 314–322, a film of lithium niobate-lithium tantalate solid solution is formed on a substrate of lithium tantalate single crystal by the liquid phase epitaxial process. According to the description in "Appl. Phys. Letters", Vol. 26, No.1, (1975), pp 8–10, a thin film of lithium niobate single crystal is formed on a substrate of lithium tantalate single crystal by the liquid phase epitaxial process. According to the description in "Journal of Crystal Growth", 50, (1980), pp 291–298, a thin film of lithium niobate single crystal is formed on a substrate of lithium tantalate single crystal by so called "Capillary Liquid Epitaxial" process. However, this process based on a principle different from that of an ordinary liquid phase epitaxial process. Moreover, the document does not disclose the formation of a film of lithium niobate- lithium tantalate solid solution.

The film-forming method in the liquid phase epitaxial process will be schematically explained. First, lithium niobate (a solute) and LiVO$_3$ (a melting medium) are charged and mixed together. A saturation temperature corresponding to a melt having the charged composition is taken as "T0". While a temperature of the melt is held at T1 higher than the saturation temperature T0, lithium niobate and LiVO$_3$ are uniformly melted. Then, the melt is led to supercooled state by lowering the temperature of the melt to a temperature lower than the saturation temperature T0. A substrate is contacted with the supercooled melt.

The inventors considered the following process for producing optical waveguide devices with high quality. In the process, a single crystal film is formed on a single crystal substrate by the liquid phase epitaxial process to provide the film having a refractive index higher than that of the substrate and the single crystal film is utilized as an optical waveguide.

A refractive index of lithium tantalate is lower than that of lithium niobate. Lithium niobate and lithium tantalate may be mixed with each other in any proportion to produce solid solution. The larger the content of tantalum in the solid solution, the lower the refractive index thereof. Therefore, a substrate of lithium tantalate single crystal has been used as a substrate on which a film of the solid solution or lithium niobate is produced by the liquid phase epitaxial process. Because the refractive index of lithium tantalate is lower than that of the solid solution or lithium niobate and when the film of the solid solution or lithium niobate is produced on the substrate of lithium tantalate single crystal, the film may be utilized as the optical waveguide.

SUMMARY OF THE INVENTION

A curie temperature of lithium tantalate is about 600° C. and a film-forming temperature of the film of solid solution or lithium niobate is higher than 700° C. in the liquid phase epitaxial process. Therefore, when the substrate of lithium tantalate single crystal with single domain structure is used, the substrate is converted to multi domain structure during the film-forming process to degrade its crystallinity. Moreover, the film was epitaxially grown on the substrate with the multi domain structure and therefore had multi domain structure. Consequently, it was difficult to produce the film with excellent crystallinity and single domain structure. For utilizing the thus produced thin film with multi domain structure as optical devices, it is necessary to subject the film to a treatment for converting multi domain structure to the single domain structure. However, such treatment inevitably causes damage to the crystallinity of the thin film.

Heretofore, a substrate of lithium niobate single crystal with excellent crystallinity (so called "optical grade") may be obtained. However, up to now, a substrate of lithium tantalate single crystal produced by the Czochralski process has crystallinity inferior than that of the substrate of lithium niobate single crystal of the optical grade. Therefore, if a single crystal film is formed on the substrate of lithium tantalate single crystal having relatively poor crystallinity, it is difficult to form the film having better crystallinity than that of the film formed on the substrate of lithium niobate single crystal of the optical grade.

On the contrary, the substrate of lithium niobate single crystal is suitable for producing the film thereon by the liquid phase epitaxial process, because a curie temperature of lithium niobate single crystal is about 1200° C. and therefore the crystallinity of the single crystal is sufficiently stable at the film-forming temperature. Moreover, as described above, it is easy to obtain the substrate of lithium niobate single crystal with excellent crystallinity, because such substrate is produced by the Czochralski process.

However, a melting temperature of lithium niobate is higher than that of lithium niobate-lithium tantalate solid solution. Consequently, as a content of tantalum in the solid solution is increased, a saturation temperature of the melt required for producing the film of the solid solution by the liquid phase epitaxial process becomes higher. Therefore, it was considered that, when the substrate of lithium niobate single crystal was contacted with such melt, the film of the solid solution was not deposited on the substrate and the substrate was molten into the melt. As a result, it was considered to be difficult to form the film of the solid solution on the substrate.

An object of the invention is to form a film of lithium niobate-lithium tantalate solid solution on a substrate of lithium niobate etc. by the liquid phase epitaxial process, when a melting point of the solid solution is higher than that of the substrate.

The invention provides an article comprising:

a substrate made of single crystal having a composition of LiNb$_{1-z}$Ta$_z$ O$_3$ ($0 \leq z < 0.8$); and a film of lithium niobate-lithium tantalate solid solution formed on said substrate by liquid phase epitaxial process, wherein said solid solution comprises a composition of LiNb$_{1-x}$Ta$_x$O$_3$ ($0 \leq x \leq 0.8$, $z < x$).

The invention further provides an article comprising:

a substrate made of single crystal; and a film made of single crystal having a composition of $LiNb_{1-x}Ta_xO_3$ ($0 \leq x \leq 0.8$) grown epitaxially on said substrate, wherein a half value width of an X-ray rocking curve of the film is not more than that of the substrate.

The invention further provides an article comprising:

a substrate made of single crystal; and a film made of single crystal grown epitaxially on said substrate, wherein said film comprises a composition of $LiNb_{1-x}Ta_xO_3$ ($0 \leq x \leq 0.8$) and a molar ratio of tantalum in said film is larger than a molar ratio of tantalum in said substrate.

The invention further provides a process for producing an article comprising a substrate made of single crystal and a film made of single crystal, comprising a step of contacting said substrate with supercooled liquid phase of a melt to produce said film thereon, wherein said melt consists mainly of $Li_2O_3$, $Nb_2O_5$, $Ta_2O_5$ and a flux, and a composition of said liquid phase falls within a region encompassed by a straight line K, linking a point A (95, 5, 0) and a point B (95, 2, 3), a straight line G linking the point A (95, 5, 0) and a point C (60, 40, 0), a straight line H linking the point C (60, 40, 0) and a point D (60, 0, 40), a straight line J linking the point B (95, 2, 3) and a point E (0, 40, 60) and a curved line I defining a composition whose saturation temperature is not more than 1200° C., each line shown in a triangular diagram of a pseudo-ternary system of $LiNbO_3$-$LiTaO_3$—a melting medium as shown in FIG. 6.

It will be described below how the inventors attain the present invention.

The inventors examined the sequences of the liquid phase epitaxial process and especially the sequences for producing supercooled state in a melt. Such supercooled state has been conventionally realized by fully melting a solute and a melting medium at a sufficiently high temperature of 1000°–1300° C. to produce the melt and setting the temperature of the melt at a temperature lower than the saturation temperature corresponding to the charged composition. That is, it was a common knowledge that it was necessary to attain the supercooled state from the liquid phase at a sufficiently high temperature.

However, the present inventors examined the liquid phase epitaxial process and failed to produce films made of single crystal with reasonable reproducibility. The reason for such result will be explained below. First, it is possible to form the film according to the liquid phase epitaxial process at a temperature lower than that required for producing it according to the Czochralski process, therefore the former process may inherently provide the film with excellent crystallinity.

However, as the concentration of the solute increases, the saturation temperature increases and approaches the growing temperature in the Czochralski process. Therefore, in order to form the film having excellent crystallinity, it is necessary to form the film at as low a temperature as possible. From this viewpoint, it is preferable to form the film at a temperature not more than 1000° C.

On the other hand, when the concentration of the solute decreases and particularly when the saturation temperature becomes not more than 1000° C., the slope of the liquid phase line of the pseudo-binary system becomes very great. Therefore, even if the concentration of the solute in the melt slightly changes, the saturation temperature largely varies. In the liquid phase epitaxial process, the melt is kept at a temperature not less than the saturation temperature, and the film is formed in the supercooled melt at the film-forming temperature lower than the saturation temperature. The crystallinity of the film is determined by the nature of the above supercooled melt, which is substantially affected by the saturation temperature and the film-forming temperature.

Therefore, when the concentration of the solute in the melt slightly changes during the above process, it becomes impossible to form the film having excellent crystallinity. Particularly, when the film-forming process is repeated during actual process, the composition of the melt changes with high response. Consequently, it is difficult to keep the concentration of the solute constant. Therefore, it is difficult to form the films with reasonable reproducibility.

Having noted this point, the present inventors developed a process essentially different from the conventional ones. This process will be explained referring to FIGS. 1 to 3. FIG. 1 and FIG. 3 are graphs schematically showing the temperature schedules of the melts in the novel liquid phase epitaxial process established by the present inventors, respectively. FIGS. 2(a) and 2(b) schematically show the state of the melt in a crucible 1.

First, a solute and a melting medium are charged and mixed in the crucible 1. The saturation temperature To of the melt is one-to-one determined by the concentration of the solute in the melt, that is, corresponding to the charged composition. This saturation temperature can be calculated from the liquid phase curve of the pseudo-binary system of the solute and the melting medium.

While the temperature of the melt is kept at T1 higher than the saturation temperature To, the solute and the melting medium are uniformly melted. In FIG. 1, "A" corresponds to the molten state. As shown in FIG. 2(a), the mixture is entirely in the form of a liquid phase.

Next, the temperature of the melt is lowered down to a solid phase-precipitating temperature T2 lower than the saturation temperature To. At this temperature T2, the melt is first kept in supercooled state. When the melt is kept at the temperature T2 for a sufficiently long time, a solid phase comes out from the melt. In FIG. 1, "B" corresponds to a stage in which the melt is kept for the precipitation of the solid phase. As shown in FIG. 2(b), at that time, the melt 3 is separated into liquid phase 4 and solid phase 5. The solid phase 5 precipitates along the inner surface of the crucible 1.

Thereafter, the temperature of the melt is lowered to convert the liquid phase 4 to the supercooled state. In FIG. 1, "C" corresponds to this supercooled state. The substrate 6 is moved down towards the surface of the liquid phase 4 in the supercooled state and contacted with the liquid phase 4, thereby epitaxially growing a film of single crystal on the substrate.

The present inventors further found the following process. As shown in FIG. 3, the temperature of the melt is kept at T1 higher than the saturation temperature T0 and the solute and the melting medium are uniformly melted. In FIG. 3, "A" corresponds to the molten state. Next, the temperature of the melt is lowered to a holding temperature T2 higher than the saturation temperature To. The solid phase does not come out from the melt at the temperature T2. Then, a predetermined amount of the solute is added into the melt to increase the saturation temperature of the melt from T0 to a temperature T5, higher than T2. Therefore, the melt is kept in the supercooled state after adding the solute. When the melt is kept at the temperature T2 for a sufficiently long time, the solid phase comes out from the melt, and the liquid phase and the solid phase stably coexist. In FIG. 3, "D" corresponds to this holding state in which the melt is kept for the precipitation of the solid phase and the liquid phase and the solid phase stably coexist.

Thereafter, the temperature of the melt is lowered to a temperature T3 to convert the liquid phase 4 to the supercooled state. In FIG. 3, "C" corresponds to this supercooled state. The substrate 6 is moved down towards the surface of the liquid phase 4 in the supercooled state as shown by an arrow 7 and contacted with the liquid phase 4, thereby epitaxially growing the film of single crystal on the substrate.

In order to convert the liquid phase of the melt to the supercooled state, the substrate cooled to the temperature T3 lower than the temperature T2 may be contacted with the melt kept at the temperature T2. The melt existing near the surface of the cooled substrate is thereby cooled and converted to the supercooled state, basically same as the case that the melt itself is cooled to the temperature T3, and thus the film may be formed on the surface of the substrate.

In this way, according to the above processes, the state "B" or "D" (at the holding temperature T2), in which the solid phase and the liquid phase stably co-exist, is taken as a starting point. The liquid phase is then converted to the supercooled state by lowering the temperature in the state "B" or "D" to the film-forming temperature T3. In this way, in the state in which the solid phase and the liquid phase stably co-exist, the concentration of the solute in the liquid phase is kept at the saturated concentration at the holding temperature T2 so long as the holding temperature does not exceed the saturated temperature of the whole system.

For example, when the concentration of the solute in the melt decreases, the amount of the solid phase decreases at the holding temperature T2, corresponding to this decreased concentration. If the concentration of the solute increases, the solid phase increases corresponding to the increased concentration of the solute. Therefore, the relationship between the temperature of the liquid phase and the concentration of the solute may be always kept constant. Since the film-forming temperature T3 is as a matter of course kept constant, the difference between T2 and T3 (a degree of supercooling) is kept constant. Consequently, the supercooled state may be accurately controlled.

As a result, even if the composition of the melt changes due to repeated formation of the films onto the substrates during the actual film-forming process, the supercooled state may be almost completely kept constant. Therefore, the film of the single crystal having excellent crystallinity may be produced with high reproductivity.

Moreover, according to the processes, the films of the single crystal having predetermined quality may be repeatedly produced with high reproducibility. In addition, the crystallinity of the single crystal was considerably improved. In particular, according to the processes, when applying the condition described below, the present inventors successfully produced the film of the single crystal having a half-value width of a X-ray rocking curve smaller than that of the single crystal substrate. Such film has not been produced in the art.

The reason for such considerable effects is not clear. However, the following explanation may be submitted. According to the conventional process, the solute is uniformly molten in the melting medium to form a uniform liquid phase when the substrate is contacted with the melt. Therefore, the appearance of the solid phase occurs at the first time in the whole liquid phase on the surface of the substrate, at the moment that the substrate contacts the melt. Therefore, it is thought that a relatively large nucleation energy is needed to start the growing of the single crystal film. When the single crystal film starts to grow at the interface between the substrate and the film, the large nucleation energy may cause disorder in the atomic order at the interface. The epitaxial film sequentially comes out on the atomic order at the interface and thus the crystallinity thereof may be influenced by the disorder at the interface and be degraded.

On the other hand, according to the above processes, as shown in FIG. 2(b), the solid phase 5 preliminarily coexists in the melt 3 before the substrate 6 contacts the melt 3. In this state, melting and precipitation simultaneously occur at the interface between the solid phase 5 and the liquid phase 4 as viewed microscopically. Therefore, when the substrate 6 is contacted with the liquid phase 4, the film starts to grow smoothly to produce the single crystal film having excellent crystallinity.

The inventors realized processes for accurately controlling the supercooling state and have been tried to produce a film made of lithium niobate-lithium tantalate solid solution on a substrate of lithium niobate single crystal according to the processes. It was considered that such a film was difficult to produce on the substrate due to the relationship of the solubilities of the film and the substrate.

Contrary to their expectation, the inventors successfully formed the above solid solution films over a considerably wide range of the compositions on the substrate and thus attained to the invention.

Actually, it was possible to produce the solid solution film with a composition fallen within $LiNb_{1-x}Ta_{xO3}$ ($0<x\leq0.8$).

Moreover, the inventors successfully doped tantalum into lithium niobate single crystal constituting the substrate and produced a substrate made of lithium niobate- lithium tantalate solid solution, and then tried to produce the film made of lithium niobate- lithium tantalate solid solution thereon. Consequently, it was confirmed that the film with a composition fallen within the wide range as described above was able to be produced thereon. A composition of the substrate may be described as $LiNb_{1-z}Ta_zO_3$ ($0<z\leq0.8$) and "x" and "z" satisfies a relationship of z<x. Therefore, "z" satisfies a relationship of $0<z<0.8$. That is, a content of tantalum in the solid solution film is larger than that in the substrate.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

For a better understanding of the invention, reference is made to the attached drawings, wherein:

FIGS. 2(a) and 2(b) are sectional views schematically illustrating the state of the melt in the crucible 1;

FIG. 3 is a graph schematically showing another temperature schedule of the melt in the novel liquid phase epitaxial process comprising the step of maintaining the melt at the holding temperature so that the solid phase and the liquid phase stably coexist;

FIGS. 7(a), 7(b) and 7(c) are graphs schematically showing relationships of the content of LiTaO$_3$, the elusion rate of lithium niobate content from the substrate and the precipitation rate of the solid solution film on the substrate in the above pseudo ternary system;

FIG. 8 is a front view schematically showing an article comprising a substrate 6 made of lithium niobate single crystal and a film 10 made of the solid solution formed thereon;

FIG. 9 is a front view schematically showing an article comprising the substrate 6, the film 10 formed thereon, and a second layer 13 functioning as an optical waveguide.

DETAILED DESCRIPTION OF THE INVENTION

The above process will be described below in more detail. A melt for contacting with the substrate mainly consists of Li$_2$O, Nb$_2$O$_5$, Ta$_2$O$_5$ and a flux. It is necessary to formulate the melt so that a charged content (a molar ratio) of Li$_2$O is substantially equal to a sum of charged contents (molar ratios) of Nb$_2$O$_5$ and Ta$_2$O$_5$. The melt may be considered to be a pseudo-ternary system of LiNbO$_3$-LiTaO$_3$—a melting medium consisting of LiNbO$_3$ and LiTaO$_3$ as the solutes and the flux as the melting medium. Moreover, the melt may be considered to be a pseudo-binary system of LiNb$_{1-x}$Ta$_x$O$_3$—a melting medium consisting of LiNb$_{1-x}$Ta$_x$O$_3$ as the solute and the flux as the melting medium. Such flux may preferably be V$_2$O$_5$, B$_2$O$_3$, MoO$_3$, WO$_3$.

Figure 4:
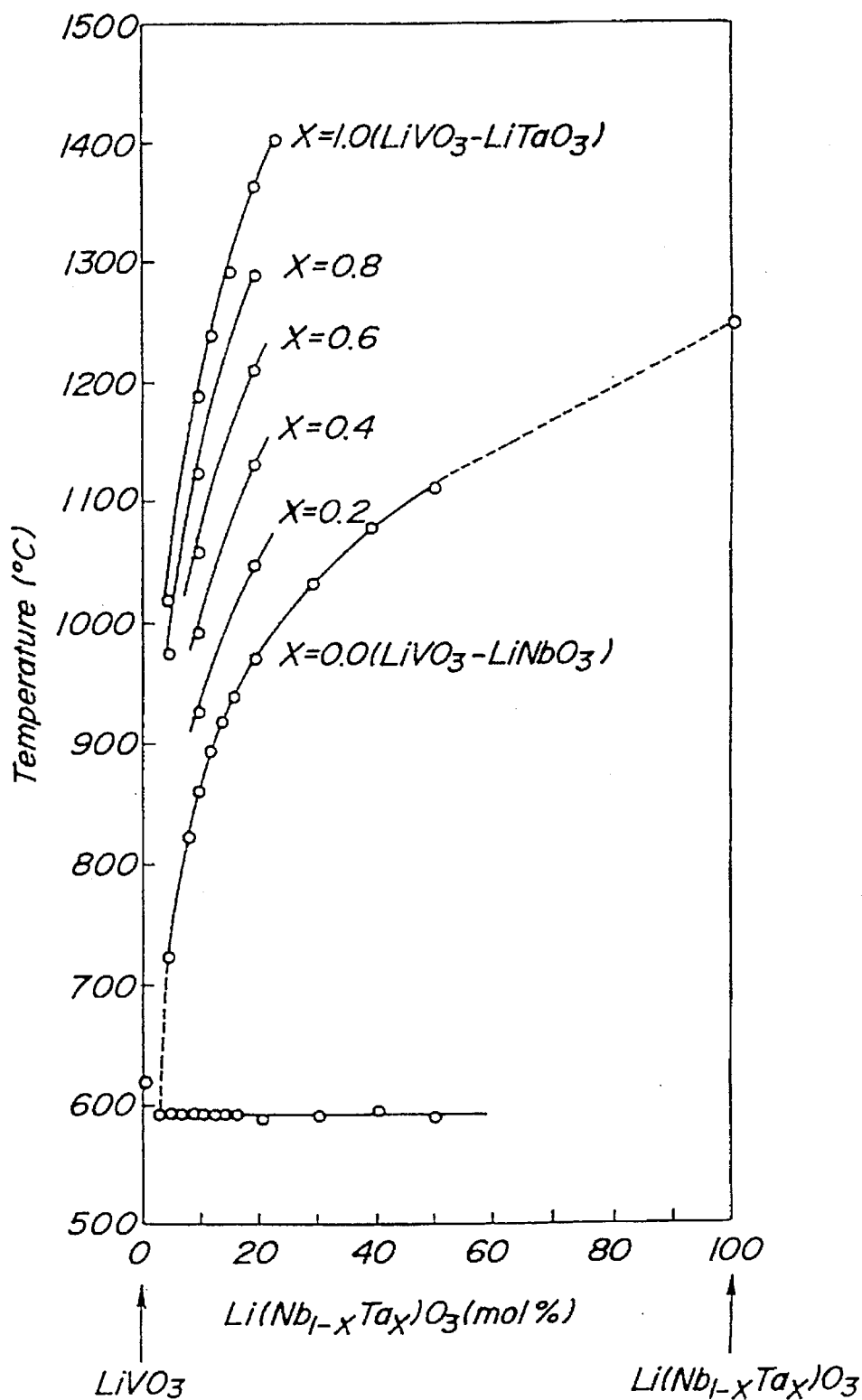
FIG. 4 is a phase diagram of a pseudo-binary system of $LiNb_{1-x}Ta_xO_3$—$LiVO_3$.
Figure 5:
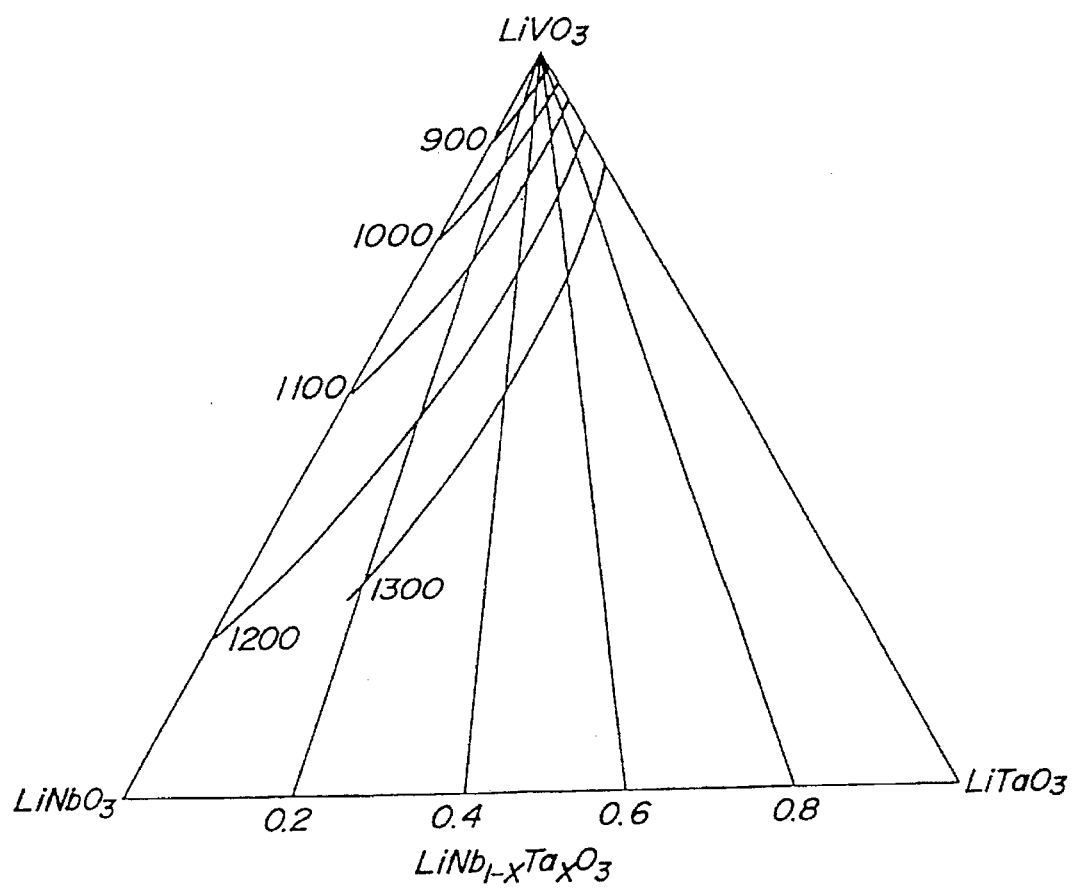
FIG. 5 is a triangular diagram of a pseudo-ternary system of $LiNbO_3$, $LiTaO_3$ and $LiVO_3$ which is another representation of the phase diagram shown in FIG. 4.

FIG. 4 is a phase diagram of the pseudo-binary system of LiNb$_{1-x}$Ta$_x$O$_3$—LiVO$_3$. The lateral axis shows the content of LiNb$_{1-x}$Ta$_x$O$_3$ in molar %. The vertical axis shows a temperature. FIG. 5 is a triangular diagram of the pseudo-ternary system of LiNbO$_3$, LiTaO$_3$ and LiVO$_3$, which is another representation of the phase diagram shown in FIG. 4. The each of numerals from "900" to "1300" in FIG. 5 is a numeral indicating a saturation temperature corresponding to each composition at each point.

First, it is necessary to control the composition of the saturated liquid phase within a range in which the saturation temperature in not higher than 1200° C. in this triangular diagram. Because, the curie temperature of the substrate made of lithium niobate is about 1200° C. and when the substrate is contacted with the liquid phase at a temperature higher than 1200° C., the substrate is converted to multi domain structure to give adverse effect on the crystallinity of the substrate and to make it difficult to produce the film with high quality. The range is indicated or defined by a curved line "I" in the triangular diagram.

From this viewpoint, in order to produce the films with high quality, the temperature of the liquid phase in the supercooled state may preferably be not higher than 1150° C. By applying the film-forming temperature of not higher than 1150° C., the crystallinity of the film may be further improved and, when an optical waveguide is formed in the thus produced film, optical damage occurred in the waveguide may be considerably reduced. Moreover, the film-forming temperature may preferably be not lower than 750° C., because it was rather difficult to form the above solid solution film when applying the film-forming temperature lower than 750° C.

The inventors tried to produce the films using the melts comprising various compositions shown in FIG. 5 according to the above film-forming process. Contrary to their expectation, the inventors found that it was possible to stably produce the above solid solution films in a considerably wide range of the compositions.

Figure 6:
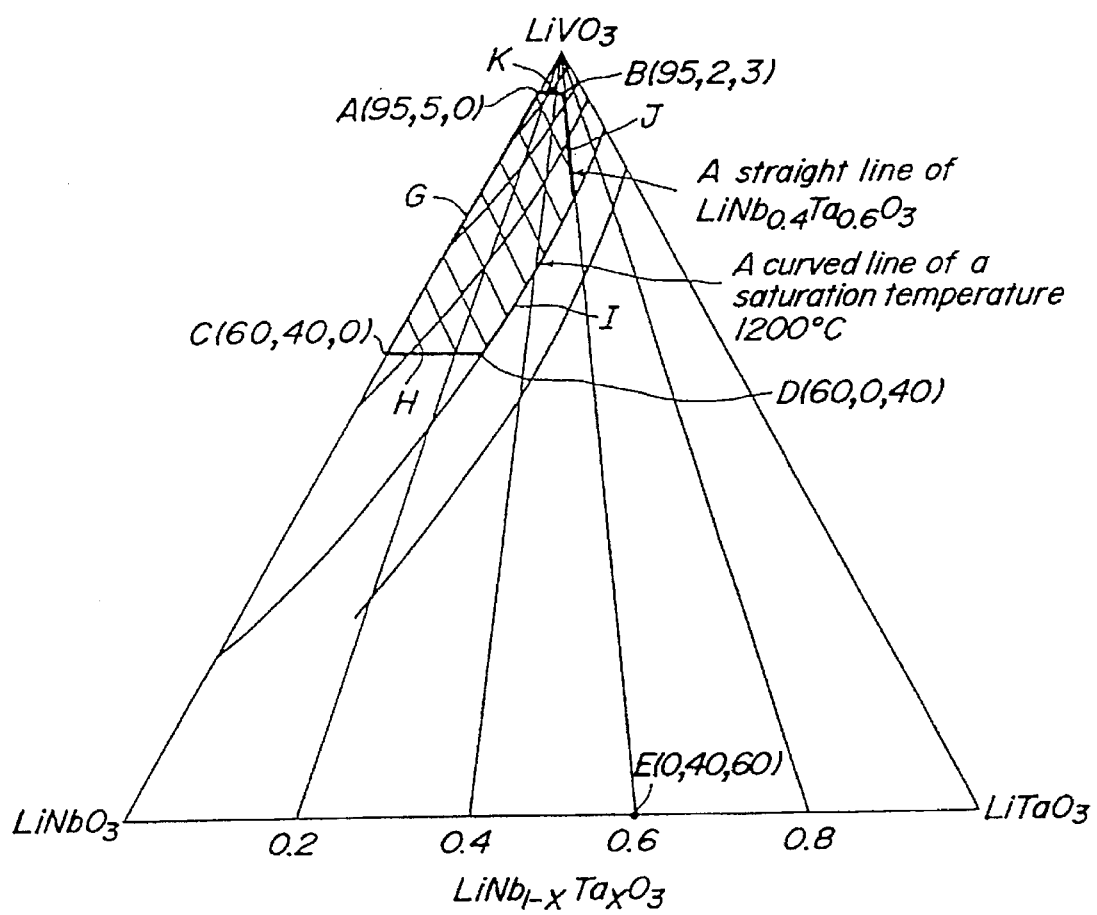
FIG. 6 is a triangular diagram of the pseudo-ternary system of LiNbO$_3$, LiTaO$_3$ and LiVO$_3$, showing a region of the compositions of the melts in which the solid solution films may be formed according to the invention.

However, it was confirmed that such a range of the compositions was a range indicated in the triangular diagram of the pseudo-ternary system shown in FIG. 6. Each numeral shown in each parenthesis corresponds to (a molar ratio of LiVO$_3$, a molar ratio of LiNbO$_3$, a molar ratio of LiTaO$_3$), respectively.

It was found that a proportion of the molar ratio of LiNbO$_3$: the molar ratio of LiTaO$_3$ was needed to be "not less than 40%": "not more than 60%". The reason is not clear, however, the following assumption was given. The assumption will be explained referring to graphs in FIGS. 7 (a) to (c). In the graphs shown in FIGS. 7(a) to (c), the vertical axis indicates rates of elusion and deposition, and the lateral axis indicates a proportion of the molar ratio of LiTaO$_3$ to the molar ratio of LiNbO$_3$.

In order to precipitate the solid solution film on the substrate made of lithium niobate single crystal, the rate of precipitation which solid comes out from the liquid phase needed to be faster than the rate of elution which lithium niobate is eluted into the liquid phase in the supercooled state. Moreover, as the molar ratio of LiNbO$_3$ is made smaller, that is, as the molar ratio of LiTaO$_3$ is made larger, a solubility of lithium niobate to the melt becomes large, and consequently, the rate of elution of lithium niobate becomes large. On the contrary, as the molar ratio of LiNbO$_3$ is made smaller, the rate of precipitation becomes small. Consequently, the rate of elution of lithium niobate exceeds the rate of precipitation at a point "F" and the film may not be produced over the point.

Besides, the degree of supercooling seems to be important. FIG. 7(a) is a graph in the example when the degree is relatively large, FIG. 7(b) is a graph when the degree is smaller than that in the example of FIG. 7(a) and FIG. 7(c) is a graph in the example when the degree is smaller than that in the example of FIG. 7(b). The smaller the degree of supercooling, the smaller the rate of precipitation of the solid solution film and, at the same time, the temperature of the liquid phase is increased and the rate of elution of lithium niobate is increased. Consequently, the upper limit of the molar ratio of LiTaO$_3$, in which the film may be produced, is decreased.

Referring to these graphs, it seems that the upper limit of the molar ratio of LiTaO$_3$ enabling the film-forming process may be improved by increasing the degree of supercooling. However, when the degree is made too large, it was difficult to control the supercooled state stably, and actually, when the degree is larger than 50° C., it was impossible to maintain the supercooled state.

From the above reasons, it was confirmed that the contents of LiTaO$_3$ in the liquid phase enabling the film-forming process comprised its upper limit. In particular, when the molar ratio of LiNbO$_3$ is lower than 40%, it was impossible to produce the film even if the condition was accurately controlled to apply the degree of supercooling near or approaching 50° C. The range of the composition is indicated or defined by a straight line "J" linking or connecting a point "B" (95, 2, 3) and a point "E" (0, 40, 60) in the triangular diagram shown in FIG. 6.

A proportion of the contents of the solute and the melting medium also comprises its limit enabling the film-forming process. That is, when the ratio of LiVO$_3$ is not higher than 60%, the film with excellent crystallinity may not be produced. The reason for such result is not clear. However, when the content of the melting medium is too small and the content of the solute is too large, the concentration of the solute in the liquid phase becomes too high and the viscosity of the liquid phase increases. Probably because of that, the film is not smoothly grown to degrade the crystallinity of the film. This range of the content or proportion is indicated or defined by a straight line "H" linking a point "C" (60, 40, 0) and a point "D" (60, 0, 40) in the triangular diagram shown in FIG. 6.

Moreover, when the content of the solute is not larger than 5%, the concentration of the solute is too small to inhibit the film-growing process, because the concentration of the solute in the melt tends to change largely during the film-growing process. This range of the content is indicated or defined by a straight line "K" linking a point "A" (95, 5, 0) and the point "B" (95, 2, 3) in the triangular diagram shown in FIG. 6. Besides, this range of the composition is enclosed by a straight line "G" linking the point "A" (95, 5, 0) and the point "C" (60, 40, 0).

The process or the temperature schedule of the liquid epitaxial process as described above referring to FIG. 1 to FIG. 3 was carried out to control the supercooled state stably and accurately when using the above pseudo-ternary system. However, it is considered that, when the supercooled state may be stably and accurately controlled according to another process or temperature schedule, the solid solution film fallen within the range defined by the invention may be also produced.

The above explanation was given for the case applying the substrate made of lithium niobate single crystal. However, such relationship is also confirmed in the case applying the substrate made of single crystal of lithium niobate-lithium tantalate solid solution.

Moreover, in the above examples, the explanation was made to the case applying V$_2$O$_5$ as the flux. However, when applying B$_2$O$_5$, MoO$_3$ or WO$_3$ as the flux, the results substantially same as described above were obtained.

FIG. 8 is a front view schematically showing an article 12 comprising the substrate and the thus produced film thereon. The solid solution film 10 is formed on the substrate 6 made of single crystal of each of the above composition. The compositions of the solid solution film 10 is LiNb$_{1-x}$Ta$_x$O$_3$ and the upper limit of "x" is 0.8. "x" may preferably be not less than 0.02.

In this case, when a material of the substrate is lithium niobate-lithium tantalate solid solution, the content "z'" of tantalum is not more than 0.8, and "z" may preferably be not more than 0.2. Because as "z" increases, the curie temperature of the solid solution constituting the substrate is decreased. When the curie temperature is not higher than the film-forming temperature, the substrate and the solid solution film are converted to multi domain structure during the film-forming process, then the crystallinity of the substrate and the film are degraded and a process for converting them to single domain structure is needed again. Moreover, it is necessary to increase the film-forming temperature to some degree to produce the film with particularly excellent crystallinity. From this viewpoint, when "z" is not more than 0.2 and applying the ordinal film-forming temperature, the curie temperature of the substrate does not possibly exceed the film-forming temperature.

As schematically shown in FIG. 9, a second layer 11 made of lithium niobate-lithium tantalate solid solution may be further formed on the solid solution film 10 to produce an article 13. Then, the composition of the second layer 11 is LiNb$_{1-y}$Ta$_y$O$_3$ (0≦y≦0.8) and "x" and "y" satisfy "y"<"x".

Consequently, a refractive index of the second layer 11 is smaller than that of the solid solution film 10 and the thus formed second layer 11 may be utilized as an optical waveguide. As described above, the article may be provided at the first time comprising the substrate made of lithium niobate single crystal doped with tantalum or not and the optical waveguide formed in the film of lithium niobate-lithium tantalate solid solution.

The thus obtained article 13 may be widely used as a material for various kinds of optical articles. Such optical articles include, for example, an optical external modulator, an optical switching device, an optical booster used in an optical communication field etc., so called SHG devices used in an optical pick-up device etc., an optical integrated circuit or the like for an optical fiber gyroscope used in an optical measuring equipment.

In the article shown in FIG. 9, the second layer 10 is generally used as the optical waveguide. From this viewpoint, it is necessary to increase the difference between the refractive indexes of the solid solution film 10 and the second layer. The difference may preferably be not less than 0.1.

A rare earth element or elements may be contained in the solid solution film or the substrate of the invention as the doping element. Such rare earth element acts as an additive for laser oscillation. Such rare earth element may preferably be Nd, Er, Tm, Ho, Dy, Pr.

Moreover, the solid solution film or the substrate may contain one or more metal element selected from the group consisting of zinc, scandium, magnesium, indium, titanium and vanadium. These metal element acts as an additive for improving the optical damage resistivity.

Figure 1:
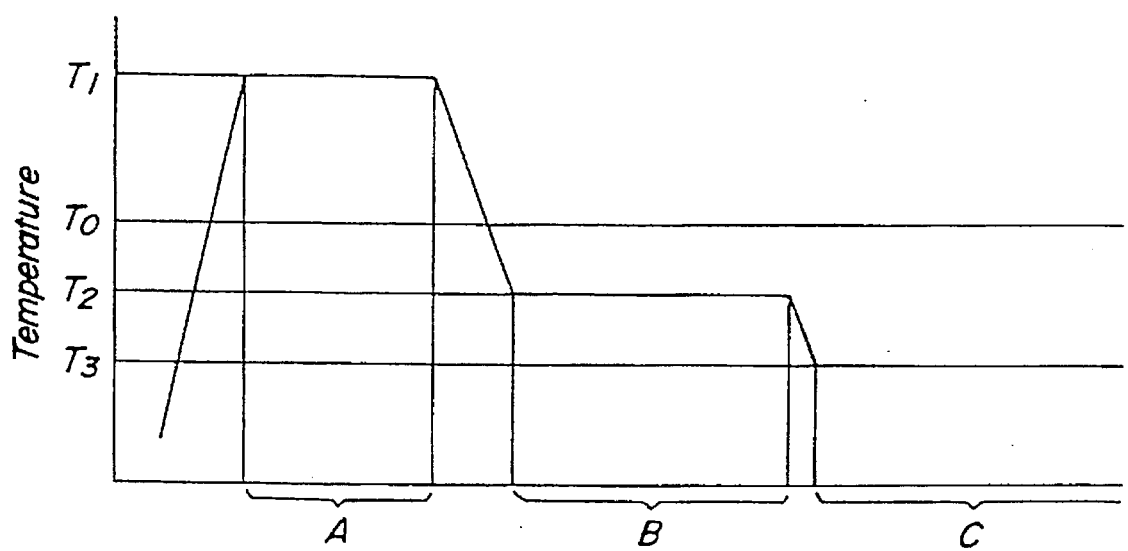
FIG. 1 is a graph schematically showing the temperature schedule of the melt in the novel liquid phase epitaxial process comprising a step of maintaining the melt at a holding temperature so that the solid phase and the liquid phase stably coexist.

Then, the present inventors adopted the film-forming process as explained referring to FIGS. 1 to 3 and successfully produced the film made of the solid solution having a half-value of an X-ray rocking curve smaller than that of the substrate of the optical grade made of lithium niobate single crystal. Then they produced an optical waveguide in the film and evaluated optical properties of the optical waveguide. The inventors found and confirmed that optical damage resistivity of the optical waveguide was conspicuously improved. Consequently, the articles of the invention may be utilized widely as various optoelectric devices.

Now, the half-value width of the X-ray rocking curve will be explained. The crystallinity of the single crystal substrate and the solid solution may be evaluated by their half-value widths of the X-ray rocking curves. In general, it is considered that the smaller the half-value width, the more excellent the crystallinity of the single crystal. Since this value itself varies depending upon a standard crystal etc. used in an X-ray measuring apparatus, its absolute value cannot be identified.

However, the crystallinity of the solid solution film produced by the liquid phase epitaxial process is strongly influenced by the crystallinity of the single crystal substrate. Therefore, whether the crystallinity of the solid solution film produced is excellent or not must be judged with reference to the half value width of the X-ray rocking curve of the substrate used. Particularly, since the single crystal substrates of the optical grade are produced at present by the Czochralski process, it is preferable that the half value width of the solid solution film is smaller than that of the optical grade single crystal substrate.

A difference (a degree of supercooling) between the film-forming temperature and the holding temperature at which the liquid phase and the solid phase coexist may preferably be not more than 20° C. to reduce the half value width of the solid solution film.

(EXPERIMENTS)

In the following, specific experimental results will be described.

(Experiment 1)

Films were formed according to the liquid phase epitaxial process and the temperature schedule shown in FIG. 1. In a $LiNbO_3$-$LiTaO_3$—$LiVO_3$ pseudo-ternary system, the process according to the invention was effected along the conditions shown in table 3.

Each melt 2 was stirred at a sufficiently high temperature T1 (1000° C.–1300° C.) for not less than 3 hours to attain a sufficiently uniform liquid state. Then, after the melt was cooled to a holding temperature T2, the melt was held at the temperature for not less than 12 hours until nuclei of lithium niobate-lithium tantalate solid solution were formed and solid phase 5 precipitated. Liquid phase 4 in the melt was in the saturated state at the temperature T2, and the liquid phase 4 and the solid phase 5 of the solid solution coexisted in the melt 3. The holding temperatures T2 and the compositions of the liquid phase 4 were changed as shown in tables 1 and 2.

Then, the melt 3 was cooled from T2 to the film-forming temperature T3, lower than T2 by a degree of supercooling Δ. Immediately after that, a substrate 6 of lithium niobate single crystal was contacted with the liquid phase 4 to produce a film. The degrees of supercooling ΔT were also changed as shown in tables 1 and 2.

The thus formed films made of the solid solution comprised compositions of $LiNb_{1-x}Ta_xO_3$. The values of "x" were measured and shown in tables 1 and 2. The half value width of X-ray rocking curve of each solid solution film was measured and shown in tables 1 and 2.

The half-value widths were measured with use of reflection at a (0012) face according to a double-crystal method. A CuKα 1 ray was used as an incident X-ray, and a (422) face of GaAs single crystal was used as a monochromater.

A half-value width of the X-ray rocking curve of each substrate of lithium niobate single crystal of the optical grade used by the inventors was 6.8 to 6.9 (arc sec), and these values were taken as standards for evaluating the crystallinity of the solid solution films.

TABLE 1

| Holding temperature T2 (°C.) | Composition of liquid phase of melt | Degree of supercooling ΔT (°C.) | Composition of the film X | Half value width (sec) |
|---|---|---|---|---|
| 950 | 93:4:3 | 15 | 0.41 | 5.7 |
| 950 | 88:10:2 | 5 | 0.22 | 5.6 |
| 950 | 83:16:1 | 3 | 0.10 | 5.6 |
| 1000 | 93:3:4 | 42 | 0.68 | 5.7 |
| 1000 | 90:6:4 | 13 | 0.36 | 5.7 |
| 1000 | 80:18:2 | 5 | 0.12 | 5.8 |
| 1050 | 88:6:6 | 23 | 0.76 | 5.6 |
| 1050 | 80:16:4 | 6 | 0.27 | 5.7 |
| 1100 | 83:10:7 | 47 | 0.78 | 5.8 |
| 1100 | 65:31:4 | 7 | 0.09 | 5.6 |
| 1150 | 77:14:9 | 30 | 0.65 | 5.9 |

TABLE 1-continued

| Holding temperature T2 (°C.) | Composition of liquid phase of melt | Degree of supercooling ΔT (°C.) | Composition of the film X | Half value width (sec) |
|---|---|---|---|---|
| 1150 | 65:28:7 | 16 | 0.29 | 5.9 |
| 1200 | 73:16:11 | 40 | 0.76 | 7.4 |
| 1200 | 65:25:10 | 30 | 0.46 | 7.3 |

TABLE 2

| Holding temperature T2 (°C.) | Composition of liquid phase of melt | Degree of supercooling ΔT (°C.) | Composition of the film X | Half value width (sec) |
|---|---|---|---|---|
| 1230 | 70:18:12 | 35 | 0.50 | 18.6 |
| 1230 | 62:27:11 | 28 | 0.41 | 20.1 |

As can be seen from the results, in which the films were formed at various temperatures, in table 1, it was possible to produce the solid solution films with excellent crystallinity and small half value widths when the composition of the film satisfies the condition according to the invention and the saturation temperature is not more than 1200° C. Particularly, when the saturation temperature corresponding to the composition is not more than 1150° C., the half value width of the solid solution film was smaller than that of the substrate made of lithium niobate single crystal. That is, it was possible to form the solid solution film with excellent crystallinity, superior that of the substrate of the optical grade.

On the contrary, as can be seen from table 2, when the saturation temperature was more than 1200° C., the half value width of the solid solution film considerably increased.

Moreover, as can be seen from table 1, by applying the process and the temperature schedule described referring to FIG. 1, the solid phase precipitates during the holding stage at the temperature T2. Thus, it is possible to produce the film at a temperature selected from a wide range when the charged composition of the solute and the melting medium variously changed. Moreover, the half value of each film produced using each melt with the variously changed charged composition was conspicuously decreased.

(Experiment 2)

The solid solution films were formed by the liquid phase epitaxial process as described in the experiment 1. However, the holding temperature T2 and the composition of the liquid phase of the melt were changed as shown in table 3 and 4. The degree of supercooling of 15° C. was applied in each example to cancel the influence of the differences of the degree. The composition "x" and the half value width of each film were measured and indicated in tables 3 and 4. Besides, in the following examples, the charged composition of each melt was variously selected to change the composition of the liquid phase of the melt.

TABLE 3

| Holding temperature T2 (°C.) | Composition of liquid phase of melt | Degree of super-cooling ΔT (°C.) | Composition of the film X | Half value width (sec) |
| --- | --- | --- | --- | --- |
| 900 | 90:9:1 | 15 | 0.16 | 6.4 |
| 1000 | 80:18:2 | 15 | 0.17 | 5.6 |
| 1070 | 70:27:3 | 15 | 0.15 | 5.6 |
| 1100 | 65:31:4 | 15 | 0.18 | 5.6 |
| 1120 | 60:36:4 | 15 | 0.16 | 6.3 |

TABLE 4

| Holding temperature T2 (°C.) | Composition of liquid phase of melt | Degree of super-cooling ΔT (°C.) | Composition of the film X | Half value width (sec) |
| --- | --- | --- | --- | --- |
| 860 | 96:3:1 | 15 | 0.13 | 23.5 |
| 1140 | 55:40:5 | 15 | 0.18 | 16.5 |
| 1160 | 50:45:5 | 15 | 0.16 | 23.8 |

In each condition applied in tables 3 and 4, the saturation temperature was not more than 1160° C. and the degree of supercooling was 15° C. Such conditions were considered to be sufficient for producing the film with excellent crystallinity as shown in table 1. Moreover, the contents of $LiTaO_3$ were thought to be sufficient for forming the film with high quality as can be seen from the examples in table 1.

Actually, when the content of the melting medium was in the range of 90% to 60% in the composition of the liquid phase, it was possible to produce the solid solution film having the half value width not more than or lower than that of the substrate of lithium niobate single crystal. However, as shown in table 4, when the content of the melting medium was higher than 95%, the half value width was conspicuously and rapidly increased. Moreover, when the content of the melting medium was less than 60%, the half value width was conspicuously and rapidly increased.

(Experiment 3)

The solid solution films were produced as the experiment 1. However, the holding temperature T2 and the composition of the liquid phase of the melt were changed as shown in table 5. The saturation temperatures were selected to be not more than 1200° C., which were considered to be acceptable as can be seen from the results in table 1. The content of the melting medium was selected to be 85% which was considered to be acceptable as can be seen from the results in the experiments 1 and 2.

Then, the proportion of the molar ratio of $LiTaO_3$ to the molar ratio of $LiNbO_3$ in each example was changed as shown in table 5 and a range of the degree of supercooling in which the film-forming was possible was measured in each example applying each composition. The above results were shown in table 5.

TABLE 5

| Holding temperature T2 (°C.) | Composition of liquid phase of melt | Range of degree of supercooling in which films may be formed (°C.) |
| --- | --- | --- |
| 1000 | 85:12:3 | about 3° C.-about 50° C. |
| 1060 | 85:10:5 | about 15° C.-about 50° C. |
| 1090 | 85:8:7 | about 30° C.-about 50° C. |
| 1050 | 85:6:9 | about 45° C.-about 50° C. |
| 1200 | 85:4:11 | film-foming was impossible |

As can be seen from table 5, when the molar ratio of $LiNbO_3$: the molar ratio of $LiTaO_3$ is 12:3, it was possible to produce the films in a wide range of temperatures. When this proportion is 10:5, it was necessary to apply the degree of not less than 15° C. to produce the films with high quality. When this proportion is 8:7, it was necessary to apply the degree of not less than about 30° C. to produce the films. Moreover, when this proportion is 6:9, it became necessary to apply the degree of not less than about 45° C. to produce the films, that is, the condition for producing the films was strictly limited. Actually, Such proportion was a limit for producing the films according to the above process.

(Experiment 4)

An article 13 comprising a single crystal substrate was produced according to the process as described in the experiment 1.

However, the charged composition of the melt was selected as $Li_2O:V_2O_5:Nb_2O_5:Ta_2O_5=50:36:9:5$, the saturation temperature of the liquid phase (the holding temperature) T2 was 970° C., the degree of supercooling ΔT was 30° C. and the time period for film-forming was 10 minutes. Under the condition, a solid solution film 10 as first layer was formed on the substrate. A thickness of the film 10 was 20 μm and a content "x" of tantalum in the film 10 was 0.35. A refractive index of the solid solution film 10 was 2.248 for ordinary ray and 2.194 for extraordinary ray with a wavelength of 633 nm.

Then, the charged composition of the melt was selected as $Li_2O:V_2O_5:Nb_2O_5=50:40:10$, the saturation temperature of the liquid phase (the holding temperature) T2 was 910° C., the degree of supercooling ΔT was 5° C. and the time period for film-forming was 8 minutes. Under the condition, a second layer 11 made of lithium niobate single crystal was formed on the solid solution film 10. A thickness of the second layer 11 was 8 μm and the composition thereof was $LiNbO_3$. A refractive index of the second layer 11 was 2.286 for the ordinary ray and 2.193 for the extraordinary ray with a wavelength of 633 nm.

The thus formed second layer 11 may be utilized as an optical waveguide, because the refractive index of the second layer 11 for the ordinary ray is larger than that of the solid solution film 10. Actually, laser ray with a wavelength of 830 nm was transmitted in the second layer and measured the optical damage resistivity of the second layer 11. Consequently, the optical damage did not occur when applying the laser ray with a irradiation power of 2 mW.

(Experiment 5)

An article 13 comprising a single crystal substrate was produced according to the process as described in the experiment 4.

However, the charged composition of the melt was selected as $Li_2O:V_2O_5:Nb_2O_5:Ta_2O_5=50:40:5:5$, the saturation temperature of the liquid phase T2 was 1015° C., the degree of supercooling ΔT was 40° C. and the time period for film-forming was 15 minutes. Under the condition, a solid solution film 10 as first layer was formed on the substrate. A thickness of the film 10 was 18 μM and a content "x" of tantalum in the solid solution film was 0.63. A refractive index of the solid solution film 10 was 2.217 for ordinary ray and 2.189 for extraordinary ray with a wavelength of 633 nm.

Then, the charged composition of the melt was selected as $Li_2O:V_2O_5:Nb_2O_5:Ta_2O_5=50:42.5:5:2.5$, the saturation temperature T2 of the liquid phase was 950° C., the degree of supercooling ΔT was 20° C. and the time period for film-forming was 5 minutes. Under the condition, the second layer 11 was formed on the solid solution film 10. A thickness of the second layer 11 was 5 μm. A refractive index of the second layer 11 was 2.263 for the ordinary ray and 2.196 for the extra-ordinary ray with a wavelength of 633 nm.

The thus formed second layer 11 may be utilized as an optical waveguide, because the refractive index of the second layer 11 for the ordinary ray is larger than that of the solid solution film 10. Actually, laser ray with a wavelength of 830 nm was transmitted in the second layer and measured the optical damage resistivity of the second layer 11. Consequently, the optical damage did not occur when applying the laser ray with a irradiation power of 2 mW.

(Experiment 6)

A relationship between film-forming temperatures and contents of tantalum in the solid solution films was examined.

The solid solution films were formed by the liquid epitaxial process according to the process and the temperature schedule described referring to FIG. 1. The films were formed on the substrate of lithium niobate single crystal using the $LiNbO_3-LiTaO_3-LiVO_3$ pseudo-ternary system.

Each melt was stirred at a sufficiently high temperature T1 (1000° C.–1300° C.) for not less than 3 hours to attain a sufficiently uniform liquid state. Then, after the melt was cooled to a holding temperature T2, the melt was held at the temperature for not less than 12 hours. Then, the melt 3 was cooled from T2 to a film-forming temperature T3 lower than T2 by a degree of supercooling ΔT. Immediately after that, the substrate 6 of lithium niobate single crystal was contacted with the liquid phase 4 to produce the film.

Figure 10:
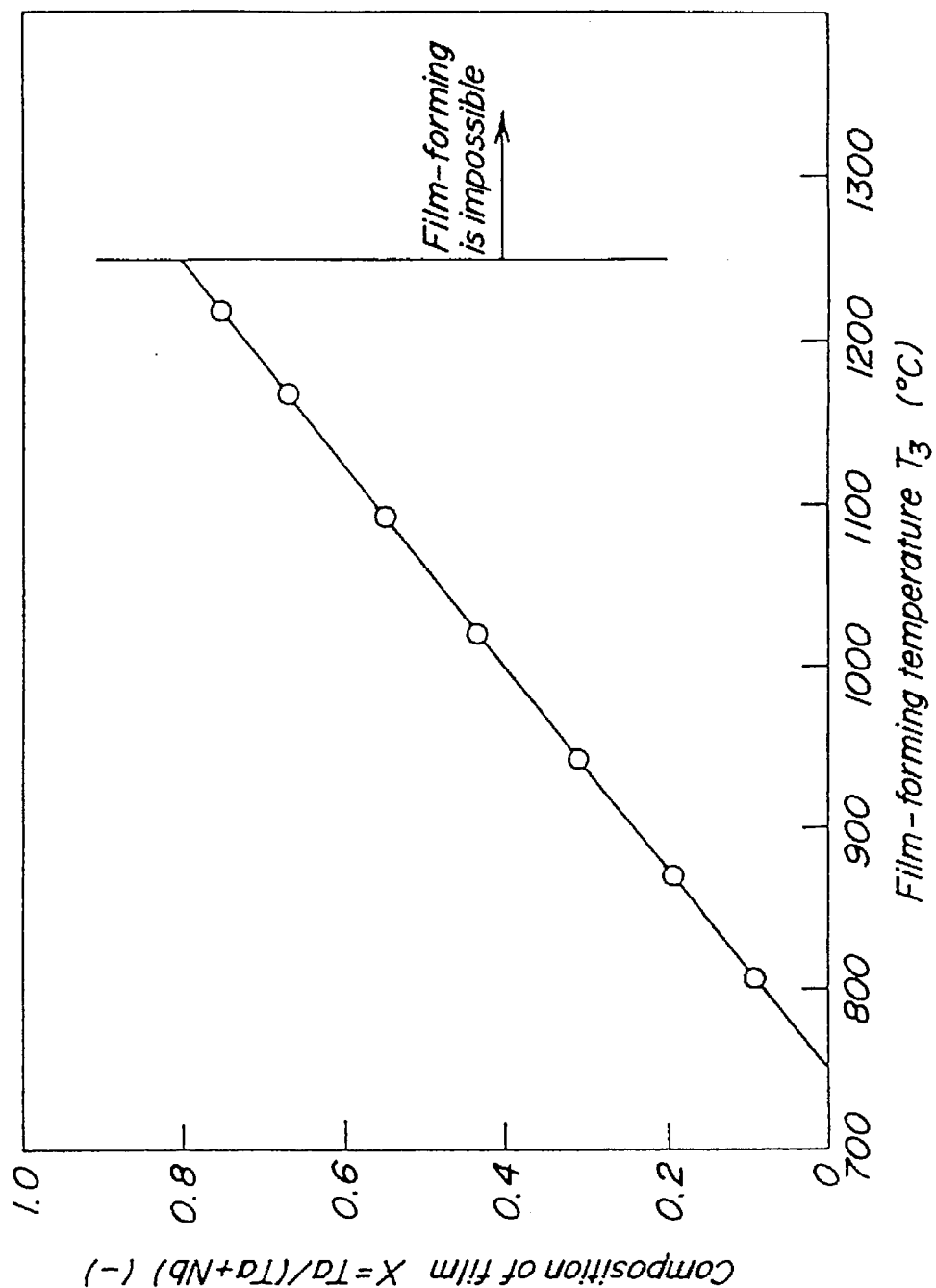
FIG. 10 is a graph showing a relationship between a film-forming temperature T3 and a content "x" of tantalum.

However, the charged composition of the melt was adjusted so that a molar ratio of $LiNbO_3$:a molar ratio of $LiTaO_3$ became 80:20. A content of $LiVO_3$ was adjusted so that the saturation temperature T0 of the melt was higher than the film-forming temperature T3 by about 100° C. Moreover, the degree of supercooling ΔT was adjusted to 10° C. The film-forming temperatures T3 were variously changed as shown in table 6 and FIG. 10. Under those conditions, the solid solution films were produced and the content of tantalum in each of the thus formed films was measured. The results were shown in table 6 and FIG. 10.

TABLE 6

| Film-forming temperature T3 (°C.) | Content of tantalum (x) |
|---|---|
| 809 | 0.094 |
| 875 | 0.202 |
| 941 | 0.310 |
| 1023 | 0.441 |
| 1102 | 0.563 |
| 1167 | 0.669 |
| 1220 | 0.751 |

As can be seen from the above results, the inventors found a linear and proportional relationship between the film-forming temperatures T3 and the contents "x" of tantalum. Therefore, now it was possible to accurately control or adjust the content "x" of tantalum in the solid solution film by accurately selecting the film-forming temperature T3 based on the knowledge about the relationship.

Besides, when the film-forming temperature was higher than 1250° C., the solid solution film may not be formed. Because the melting point of the substrate of lithium niobate single crystal is about 1250° C. and thus it was impossible to produce the solid solution on the substrate at a temperature over 1250° C. From this viewpoint, the film-forming temperature may preferably be not higher than 1230° C., and the content "x" in the solid solution film became about 0.8 when the temperature was 1230° C.

Moreover, as the film-forming temperature T3 was lowered, the content "x" of tantalum also decreased. Particularly, the inventors found that it became difficult to produce the film containing tantalum therein when the film-forming temperature was lower than 750° C. Moreover, as can be seen from the results, when forming the solid solution film, it was possible to change the content "x" in the range of not lower than 0.1 and not higher than 0.6 by adjusting the temperature of the liquid phase in supercooled state to a temperature of not lower than 800° C. and not higher than 150° C.

The inventors first found such novel technical means or method for freely and accurately control the content "x" of tantalum in the solid solution film as described above. It is obvious to those ordinary skilled in the art that such novel technical means or method is extremely useful for producing the articles comprising various properties for adopting it to various uses.

(Experiment 7)

Half value width of an X-ray rocking curve of each solid solution film with each composition produced in the experiment 6. Moreover, argon laser with a wavelength of 514.5 nm was irradiated to each of the solid solution films and the threshold value at which optical damage occur in each of the films was measured. These results were shown in table 7. As a comparative example, a thin film of lithium niobate single crystal was formed in a substrate of lithium tantalate single crystal and the above measurement was carried out about the thus formed film.

TABLE 7

| Content of tantalum (x) | Threshold value at which optical damage occurs W/cm | Half-value width of X-ray rocking curve (arc sec) | Film-forming temperature T3 (°C.) |
| --- | --- | --- | --- |
| 0.094 | not less than 20 | 5.6 | 809 |
| 0.202 | not less than 20 | 5.7 | 875 |
| 0.310 | not less than 20 | 5.6 | 941 |
| 0.441 | not less than 20 | 5.8 | 1023 |
| 0.563 | not less than 20 | 5.8 | 1102 |
| 0.669 | 0.18 | 5.7 | 1167 |
| 0.751 | 0.14 | 18.8 | 1220 |
| Comparative Example | 0.12 | 26.9 | 920 |

When the film-forming temperature was not higher than 1150° C., it was possible to produce the solid solution film with excellent crystallinity. On the contrary, when the film-forming temperature was higher than 1150° C., the crystallinity of the film was relatively degraded. However, in the latter case, the crystallinity of the film was basically same or more superior as that of the film of lithium niobate formed on the substrate of lithium tantalate in the comparative example. It is not clear the reason why the crystallinity of the solid solution film was improved by applying a film-forming temperature not higher than 1150° C. However, a curie temperature of lithium niobate constituting the substrate used is about 1150° C. It is considered that the substrate is converted to multi domain structure and the crystallinity of the substrate was degraded when producing the film at a temperature over 1150° C.

(Experiment 8)

As described above, the inventors provides a method or a technical means to accurately control the content "x" of tantalum in the solid solution film by selecting and controlling the film-forming temperature of the film. Particularly, such method or technical means is extremely useful for producing an optical waveguide of single mode. In the optical waveguide of single mode, in addition to setting a wavelength of light transmitted in the waveguide at a predetermined value and accurately controlling a thickness of the waveguide, it is indispensable to accurately control a refractive index of the waveguide at a predetermined value for propagating the light. The permissible range of the refractive index is very narrow.

However, when the content of tantalum in the solid solution film slightly changed, the refractive index of the optical waveguide considerably changed to increase propagation loss of the light. To solve this problem, the inventors studied a manufacturing process for maintaining the excellent propagation property of the optical waveguide of the single mode based on the above discovery.

The solid solution films were formed on the substrate of lithium niobate single crystal as described in the experiment 6 using 20 mol % of $LiNb_{0.8}Ta_{0.2}O_3$— 80 mol % of $LiVO_3$ pseudo-binary system. The degree of supercooling was set at 10° C. The film-forming temperature T3 was changed as shown in table 8 within a range of 900° C. to 940° C. The solid solution film of each example (a thickness of ternary 20 μm) was produced. The content "x" of tantalum in each film was measured.

Moreover, an optical waveguide was formed in each solid solution film by a so called proton exchange process under the same conditions. During this process, mask patterns made of aluminum each having a width of 2 μm were formed on the surface of each film by conventional photolithography method to provide an assembly, which was then dipped in benzoic acid of 200° C. for 15 minutes to form the waveguide. The mask patterns were removed by etching process and the waveguide was subjected to an annealing process at 350° C. for 4 hours to provide a substrate with a proton-exchange optical waveguide. Light of a wavelength of 830 nm was irradiated to the optical waveguide of each example and the propagation loss was measured. These results were shown in table 8.

TABLE 8

| Film-forming temperature T3 (°C.) | Content of tantalum (x) | Propagation loss dB/cm |
| --- | --- | --- |
| 900 | 0.240 | 30.4 |
| 904 | 0.246 | 1.2 |
| 908 | 0.253 | 0.1 |
| 912 | 0.259 | 0.1 |
| 916 | 0.266 | 0.1 |
| 920 | 0.272 | 0.1 |
| 924 | 0.278 | 0.3 |
| 928 | 0.275 | 2.6 |
| 932 | 0.291 | 3.3 |
| 936 | 0.297 | 16.1 |
| 940 | 0.304 | 22.8 |

As can be seen from the results, when "x" is within 0.246 to 0.291, the propagation losses were relatively low, and particularly when "x" is within an extremely narrow range of 0.253 to 0.272 which the difference between the upper limit and the lower limit is 0.02, the propagation loss of the optical waveguide was reduced to the minimum value, that is, 0.1. As can be seen from the results, in the optical waveguide of single mode, the permissible range of the content "x" of tantalum in the solid solution film is extremely narrow.

Simultaneously, linear and proportional relationship was found between the film-forming temperature T3 and the content "x" of tantalum. Based on such principle, it was possible to reduce the propagation loss of each optical waveguide to the minimum value by applying the film-forming temperature in the range of 904° C. to 932° C., and more preferably in the range of 908° C. to 920° C.

As described above, according to the invention, it becomes possible to produce the optical waveguides of single mode with a low propagation loss in a large scale by setting or controlling the permissible range of the film-forming temperature T3 within about 10° C. in an actual manufacturing process.

As described above, the invention provides a novel article having a substrate made of lithium niobate or lithium niobate-lithium tantalate solid solution and a film made of lithium niobate-lithium tantalate solid solution with a predetermined composition.

The invention has been explained referring to the preferred embodiments, however, the present invention is not limited to the illustrated embodiments which are given by way of examples only, and may be carried out in various modes without departing from the scope of the invention.

What is claimed is:

1. A process for producing an article, comprising:
   providing a single crystal substrate having a composition $LiNb_{1-z}Ta_zO_3$ ($0 \leq z \leq 0.8$);
   forming a film comprising lithium niobate-lithium tantalate on said substrate by liquid phase epitaxy, wherein said substrate is contacted with a melt having a liquid phase in a supercooled state, the melt consisting essentially of $Li_2O$, $Nb_2O_5$, $Ta_2O_5$ and a flux, the composition of the melt being within a region in the pseudo-ternary system of $LiNbO_3$-$LiTaO_3$—melting medium illustrated in FIG. 6, said region being bound by a straight line K interconnecting point A and point B, a straight line G interconnecting point A and point C, a straight line H interconnecting point C and point D, a straight line J interconnecting point B and point E, and a curved line I representing a composition having a saturation temperature of not greater than 1200° C., said points being defined by the following respective compositions:

|       | Composition |    |    |
|-------|-------------|----|----|
| Point | a           | b  | c  |
| A     | 95          | 5  | 0  |
| B     | 95          | 2  | 3  |
| C     | 60          | 40 | 0  |
| D     | 60          | 0  | 40 |
| E     | 0           | 40 | 60 | wherein a=mol % of the melting medium, b=mol % of the $LiNbO_3$, and c=mol % of $LiTaO_3$.

2. The method of claim 1, further comprising the step of cooling the melt from a temperature at which the liquid phase and a solid phase coexist stably, to a supercooling temperature at which said film is formed.

3. The process of claim 2, wherein the difference between said temperature at which the liquid phase and the solid phase coexist stably and the supercooling temperature is not greater than 50° C.

4. The process of claim 1, wherein a composition of said film is $LiNb_{1-x}Ta_xO_3$ ($0<x\leq0.8$), and x is determined by setting a temperature of said liquid phase in said supercooled state to be not less than 750° C. and not more than 1250° C. when forming said film.

5. The process of claim 4, wherein $0.1<x\leq0.6$, and x is determined by setting a temperature of said liquid phase in said supercooled state to be not less than 800° C. and not more than 1150° C. when forming said film.

* * * * *